United States Patent
Brennan et al.

(10) Patent No.: US 7,123,113 B1
(45) Date of Patent: Oct. 17, 2006

(54) REGULATED, SYMMETRICAL CRYSTAL OSCILLATOR CIRCUIT AND METHOD

(75) Inventors: Aaron Brennan, Moscow, ID (US); Jonathon Stiff, Beaverton, OR (US); Mike McMenamy, Tensed, ID (US)

(73) Assignee: Cypress Semiconductor Corp., San Jose, CA (US)

( * ) Notice: Subject to any disclaimer, the term of this patent is extended or adjusted under 35 U.S.C. 154(b) by 16 days.

(21) Appl. No.: 10/866,510

(22) Filed: Jun. 11, 2004

(51) Int. Cl.
*H03B 5/36* (2006.01)
*H03B 1/00* (2006.01)
*H03L 1/00* (2006.01)
*H03L 5/00* (2006.01)

(52) U.S. Cl. .................. 331/158; 331/74; 331/116 FE; 331/183; 331/186

(58) Field of Classification Search ................ 331/158, 331/182, 185, 74, 116 FE, 183, 186
See application file for complete search history.

(56) References Cited

U.S. PATENT DOCUMENTS

| 4,013,979 | A |   | 3/1977  | Vittoz |          |
|-----------|---|---|---------|--------|----------|
| 4,788,466 | A | * | 11/1988 | Paul et al. | 310/323.06 |
| 5,557,243 | A | * | 9/1996  | Ho | 331/158 |
| 5,774,006 | A | * | 6/1998  | Barel et al. | 331/74 |
| 5,999,062 | A | * | 12/1999 | Gilbert | 331/116 R |
| 6,696,898 | B1 | * | 2/2004 | Ward et al. | 331/116 FE |
| 6,759,914 | B1 | * | 7/2004 | Rusznyak | 331/116 FE |
| 6,798,301 | B1 | * | 9/2004 | Balan et al. | 331/74 |

OTHER PUBLICATIONS

Bianchi et al., "Analog ALC Crystal Oscillators for High-Temperature Applications," IEEE Transactions on Solid-State Circuits, vol. 35, No. 1, Jan. 2000, pp. 2-14.
Margarit et al., "A Low-Noise, Low-Power VCO with Automatic Amplitude Control for Wireless Applications," IEEE Journal of Solid-State Circuits, vol. 34, No. 6, Jun. 1999, pp. 761-771.
Vittoz et al., "High-Performance Crystal Oscillator Circuits: Theory and Application," IEEE Journal of Solid-State Circuits, vol. 23, No. 3, Jun. 1988, pp. 774-783.

* cited by examiner

*Primary Examiner*—Robert Pascal
*Assistant Examiner*—James Goodley
(74) *Attorney, Agent, or Firm*—Kevin L. Daffer; Daffer McDaniel, LLP

(57) ABSTRACT

An oscillator circuit is provided that is preferably a crystal oscillator, where voltage placed across the crystal is regulated. The regulated voltage or amplitude of the cyclical signal across the crystal is monitored and maintained through a regulation circuit that measures a peak voltage across the crystal. Once the peak voltage exceeds a predetermined setpoint value, then a controller within the regulation circuit will reduce a biasing current through an amplifying transistor within the amplifier coupled across the crystal input and output nodes. By regulating the biasing current, gain from the amplifier is also regulated so that unwanted non-linearities and harmonic distortion is not induced within the crystal to cause frequency distortion and unwanted modes of oscillation within the crystal. The amplifier is preferably symmetrical in that the amplifier sources and sinks equal current to reduce unwanted peaks at the negative or positive half cycles of the sinusoidal signal.

14 Claims, 6 Drawing Sheets

REGULATED, SYMMETRICAL CRYSTAL OSCILLATOR CIRCUIT AND METHOD

BACKGROUND OF THE INVENTION

1. Field of the Invention

The present invention relates to an oscillator and, more specifically to a crystal oscillator having a regulated, symmetrical amplitude to minimize non-linearities and deleterious stimulation of harmonic modes of oscillation.

2. Description of the Related Art

The following descriptions and examples are not admitted to be prior art or conventional by virtue of their inclusion within this section.

Within nearly every electronic subsystem is some sort of generator that produces cyclical waveforms. The waveform generator is oftentimes referred to as an oscillator for producing regular oscillation signals. Depending on the application, an oscillator can be used simply as a source of regularly spaced pulses or clock signals. Oscillators are oftentimes rated depending on their stability and accuracy, frequency adjustability (i.e., tunability), and power consumption.

There are numerous types of oscillators in the marketplace. A simple kind of oscillator is an RC relaxation oscillator. More complex and stable oscillators involve the more popular LC oscillator. While LC oscillators are more stable than RC oscillators, a crystal oscillator is generally more stable than LC oscillators.

Crystal oscillators use a piece of quartz (i.e., glass or silicon dioxide) that is cut and polished to vibrate at a specified frequency. Quartz is piezoelectric, wherein acoustic waves in the crystal are driven by an applied electric field and, in turn, can generate a voltage at the surface of the crystal. The quartz thereby operates as a resonator that is pre-tuned to a specific resonant frequency. The resulting effect is that of a modeled RLC circuit that produces a rapidly changing reactance with frequency, with the RLC-modeled crystal providing positive feedback and gain at the resonant frequency, leading to sustained oscillations.

In order to initiate and maintain strain on the crystal, a crystal oscillator generally includes an amplifier coupled across nodes of the crystal. While the least impedance value across the crystal occurs at its resonant frequency, an amplifier that drives the crystal may "pull" the frequency of the crystal depending on certain performance traits of that amplifier. For example, an amplifier can be formed using bipolar transistors, field-effect transistors (FETs), or a combination thereof. Depending on how the transistors are manufactured and connected, the transistors can operate in both linear and non-linear voltage regions. The motional impedance of each possible mode of oscillation within the crystal and the current through the motional impedance $Z_M(i)$ is proportional to the amplitude of oscillation at mode i. Thus, as the amplitude of oscillation changes, the amplifier can go from a linear operation to a non-linear operation. For example, when a critical transconductance of a transistor within the amplifier is exceeded by applying a bias current thereto above a critical value, oscillation will increase.

Non-linear effects start appearing when the amplitude of the sinusoidal driving voltage of the transistor becomes so large as to generate harmonics in the output current from the amplifier. The non-linear effects and resulting induced harmonics within the crystal predominate if the transistors operate outside a weak inversion range and, thus, within what is known as the "saturation range." If operated in the non-linear regions of strong inversion or saturation, the overall stability of the crystal will be negatively impacted. Harmonics are created across the crystal to distort the driving voltages across $Z_M$. These harmonics are then intramodulated in the device non-linearity, eventually creating an additional fundamental component with a different phase that shifts the frequency of oscillation. If, for example, a harmonic is produced that is close enough in frequency to an unwanted mode of vibration i of the crystal, the oscillation frequency will be at the unwanted mode i, provided there is sufficient gain to sustain oscillation. Non-linear effects can also appear if the output current of the amplifier is not symmetrical for a given input voltage amplitude. The current the amplifier can source for negative input voltage amplitudes should desirably be equal in magnitude to the amount of current the amplifier can sink for positive input voltage amplitudes of the same magnitude. Harmonics can be reduced with increased amplifier symmetry.

It would be desirable to utilize the benefits of a crystal oscillator, but without the non-linear effects that cause deleterious harmonic components to exist within the crystal. It would, therefore, be desirable to introduce an amplifier that operates with the positive feedback from the crystal that is regulated to operate with symmetrical voltages and currents across the crystal nodes to promote stability and diminish stimulation of harmonic modes of oscillation.

SUMMARY OF THE INVENTION

The problems outlined above are in large part solved by an improved oscillator that, preferably, involves a crystal. The oscillator operates with minimum power into the crystal, or other resonant circuit, for a given amplitude, and also preferably diminishes any stimulation of unwanted harmonic modes of oscillation within the resonant circuit. The improved oscillator utilizes an oscillator amplifier that produces symmetrical current and voltage values within and across the nodes to which the crystal is connected. The symmetrical current and voltage values stimulate the crystals within a linear region of weak inversion of the amplifier transistors and, therefore, minimizes stimulation of harmonic modes of oscillation.

The improved oscillator avoids any semiconductor fabrication (i.e., process) dependence for regulating the amplitude of oscillation, as in many conventional systems. Moreover, the improved oscillator is yet fairly simple in structure and number of active components relative to the complex, conventional regulation systems that oftentimes use rectification and filtering. According to one embodiment, the oscillator amplifier is a modified form of a Pierce amplifier. The present amplifier is a symmetrically formed Pierce-type amplifier with a gate terminal of one transistor connected to one node, and a drain terminal of a series-connected second transistor connected to the other node. Thus, while a transistor is arranged between the pair of nodes, a second transistor is implemented in the improved Pierce-type amplifier configuration hereof. To promote symmetry, a mirrored pair of transistors and a diode-connected transistor are also used to ensure that the currents sourced from and sunk into the crystal via, for example, the $X_{OUT}$ node of the crystal are nearly equal and, thus, symmetrical across differing amplitude voltage ranges and across most semiconductor fabrication process corners.

According to one embodiment, the symmetrical Pierce-type oscillator amplifier hereof operates at maximum gain until the amplitude measured across the nodes exceeds a setpoint. A peak detector is used to determine a peak voltage value for the amplitude across the nodes. A controller circuit coupled to the peak detector then compares the peak voltage value against a predetermined voltage value or setpoint value to decrease a bias current if the peak voltage is greater in absolute magnitude than the predetermined voltage value. By decreasing the bias current through the Pierce-type amplifying transistor, the amplifier is maintained in the linear range and harmonic excitation and distortion is minimized. The oscillator amplifier thereby has an output node that can be coupled to the crystal, wherein the controller is used to adjust the bias current that is forwarded into the output node in order to regulate gain of the amplifier, and also regulate the resulting amplitude into the crystal. The regulated gain is sustained at a minimum needed to maintain oscillations within the crystal, preferably at the resonant frequency of that crystal.

According to yet another embodiment, the present oscillator can either be a crystal oscillator or simply an oscillator having an oscillator amplifier connected to a resonant circuit. If the resonant circuit is a crystal, then the crystal oscillator preferably includes a pair of nodes and a crystal coupled between the pair of nodes. The oscillator amplifier is coupled between the pair of nodes and preferably produces a sinusoidal signal upon the pair of nodes. A peak detector is coupled to at least one node of the pair of nodes for determining a peak voltage value of the sinusoidal signal, and for regulating the amplitude of the sinusoidal signal depending on an amount by which the peak voltage value exceeds a predetermined voltage value. The oscillator amplifier thereby includes a Pierce-type oscillator modified to include a first transistor and a second transistor. The first and second transistors can be FETs and/or bipolar transistors. Further, the Pierce oscillator can include a diode-coupled transistor.

The combination of the first transistor, second transistor, diode-coupled transistor, and a third and fourth transistors form an improved Pierce-type oscillator circuit that maintains symmetry of voltage and current values sent into the resonant circuit. In addition to the predetermined voltage value, a second predetermined voltage value can be established of less absolute magnitude than the predetermined voltage value. As the output from the oscillator amplifier increases during start-up operations, it is not until the output amplitude exceeds the second-predetermined voltage value will the output be enabled. In this fashion, spurious initial start-up harmonic components can be eliminated while maintaining maximum gain from the amplifier until such time as the peak voltage exceeds the predetermined value. Once the peak detector determines the excess voltage, then the amplifier will be regulated back into its linear range, and the amplitude output from the amplifier will be regulated to its optimal range.

BRIEF DESCRIPTION OF THE DRAWINGS

Other objects and advantages of the invention will become apparent upon reading the following detailed description and upon reference to the accompanying drawings in which.

Figure 1:
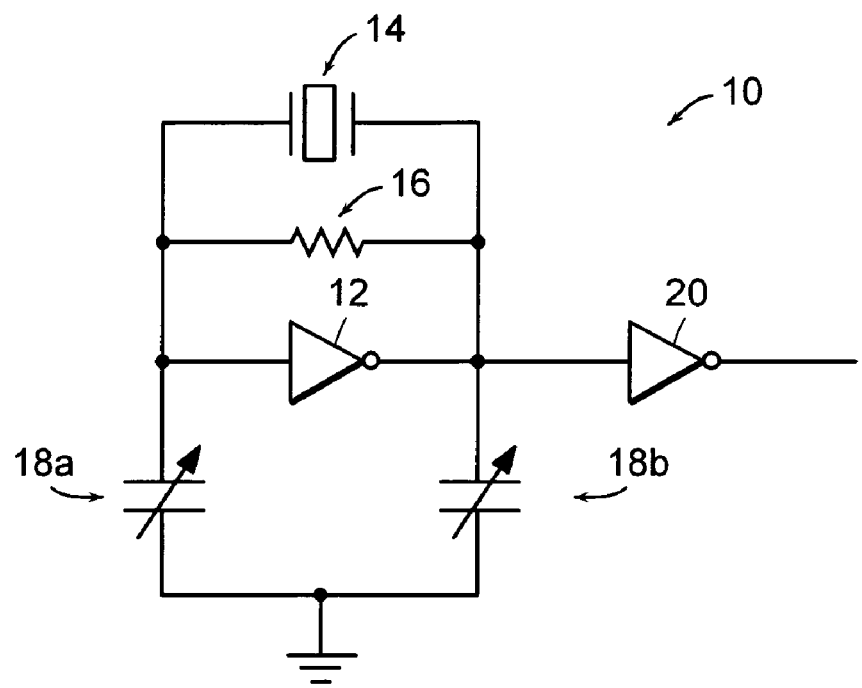
FIG. 1 is a circuit diagram of a crystal oscillator having an inverter coupled across the crystal resonator.

While the invention is susceptible to various modifications and alternative forms, specific embodiments hereof are shown by way of example in the drawings and will herein be described in detail. It should be understood, however, that the drawings and detailed description thereto are not intended to limit the invention to the particular form disclosed, but on the contrary, are intended to cover all modifications, equivalents, and alternatives falling within the spirit and scope of the present invention as defined by the appended claims.

DETAILED DESCRIPTION OF PREFERRED EMBODIMENTS

Turning now to the drawings, FIG. 1 illustrates one form of a crystal oscillator 10. While it is recognized that there are numerous types or forms of crystal oscillators, oscillator 10 involves an inverter 12 placed between nodes of a piezo-electric crystal 14. A feedback resistor 16 can also be connected between the oscillator nodes to bias those nodes to an appropriate voltage differential. The frequency of oscillation can be varied if needed by adjusting the capacitance value within the adjustable capacitors or varactors 18*a* and 18*b*, to "pull" the frequency of the quartz-crystal oscillator. If needed, only one varactor may be used with the other capacitance fixed. The resulting oscillator circuit 10 is oftentimes referred to as a voltage-controlled crystal oscillator, which combines the good-to-excellent stability of crystal oscillators with the tunability of LC oscillators. The crystal oscillator can be tuned by slightly adjusting the capacitance value of the varactor. If, for example, a single-ended output, possibly for use as a clocking output, is needed, then a buffer 20 can be used. Buffer 20 can be an inverter circuit similar to inverter 12. A preferred type of inverter is a complementary metal oxide semiconductor (CMOS) type.

Figure 2:
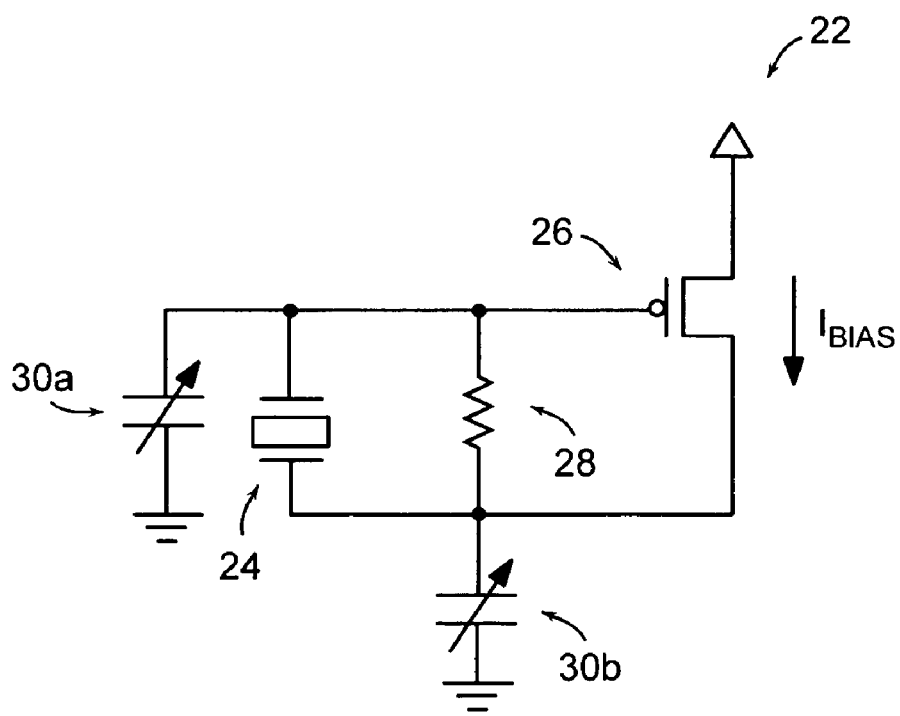
FIG. 2 is a circuit diagram of a pierce oscillator having a transistor coupled across the crystal resonator.

While oscillator 10 is illustrative of one form of crystal oscillator, oscillator 22 in FIG. 2 shows another form. Instead of an inverter placed between the piezo-electric crystal nodes, crystal oscillator 22 illustrates a crystal 24 having nodes across which the gate (or base) and drain (or collector) of transistor 26 are coupled. All other components including feedback resistor 28 and varactors 30a and 30b are coupled similar to the arrangement shown in FIG. 1.

Another contrast between the circuits of FIG. 1 and FIG. 2 is the crystal drive level, which is directly proportional to the differential voltage across the crystal. A preferred way to control the drive level of the oscillator shown in FIG. 1 is to make the relative sizes of capacitors 18a and 18b unequal or add additional resistors to provide a voltage drop between the inverter 12 and crystal 14. If the capacitance of capacitor 18a equals the capacitance of capacitor 18b, the drive level is only a function of the supply voltage applied to the inverter. This is because the oscillations will be rail to rail at $X_{IN}$ and $X_{OUT}$, if the capacitance of capacitors 18a and 18b are equal. On the other hand, the oscillator shown in FIG. 2 provides a means to control amplitude (Ibias) which does not require skewing capacitor 30a relative to capacitor 30b, or adding additional resistors. In order to use the least amount of capacitor area, the capacitance of capacitor 30a can be equal to the capacitance of capacitor 30b.

Crystal oscillator 22 is an alternative form of a Pierce oscillator. Typical Pierce configurations are recognizable by the connection of the crystal 24 between the amplifier input and the amplifier output (i.e., between the base and collector of a bipolar transistor or between the gate and drain of a FET, as respectively shown in FIG. 2). For illustration purposes only, transistor 26 is shown as a PMOS FET-type transistor. The gain of amplifying transistor 26 is controlled primarily by the bias current and, secondarily, by the amplifier non-linearities. Conversely, the gain of the amplifier 12 of FIG. 1 is controlled only by the amplifier non-linearities. As such, the amplifier of FIG. 1 will produce more harmonics. It is recognized that transistor 26 can also be configured as a bipolar transistor depending on the technology utilized.

The Pierce configuration has an added advantage in that the crystal acts as its own tuned circuit. This may eliminate the need for an adjustable inductance-capacitance (LC) tank circuit in the output. For example, you may only need an adjustable inductance-capacitance circuit in the output if you are not using the fundamental (i=1) mode of the crystal. If you want to use the third overtone mode of the crystal to get a higher oscillation frequency, a filter constructed of an inductor and capacitor(s) could be used to suppress the gain of the amplifier at the frequency of the fundamental mode so that the circuit would prefer the third mode of vibration of the crystal and operate there. Contrary to the CMOS inverter arrangement of FIG. 1, a Pierce configuration has a gain partially controlled by its current consumption (i.e., $I_{BIAS}$).

While a Pierce configuration can consume more power than a CMOS amplifier counterpart, a Pierce circuit need only employ a single transistor between the crystal nodes. A primary consideration of the single transistor arrangement is the bias network in which bias current is used to adjust gain. In addition, a single transistor enjoys less influence of the non-linear effects on the oscillation frequency. This advantage is especially desirable at relatively high frequencies for which other circuits can no longer be used due to their oscillation frequency becoming too dependent on certain parameters, such as temperature and supply voltage.

Figure 3:
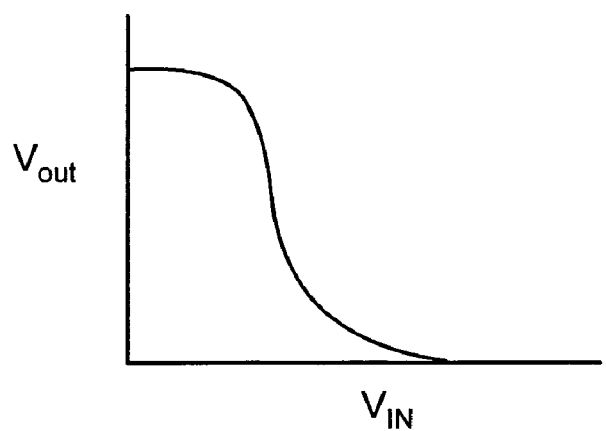
FIG. 3 is a graph of input voltage versus output voltage across the inverter of FIG. 1, showing non-linearities between input voltage peaks.

FIG. 3 illustrates some of the non-linearity effects present in CMOS inverters. Typically, a CMOS inverter connected as an amplifier, as shown in FIG. 1, has rather substantial non-linearities between the upper and lower supply rails. As shown in FIG. 3, as the input voltage $V_{IN}$ sweeps from the upper to the lower rail when encountering a sinusoidal input signal, the output voltage $V_{OUT}$ will enjoy rather significant gain near the midpoint between rails, but substantially lessened gain at or near the rails. The gain is somewhat unpredictable due to temperature and processing fluctuations and, thus, a CMOS inverter is not well-suited as a linear amplifier. In addition, it is often necessary to bias the input so that the amplifier is in an active region. The usual method is to substantially increase the feedback resistance value through a shunt feedback arrangement. Therefore, a more preferred alternative would be to utilize a Pierce configuration (as shown in FIG. 2) rather than a CMOS inverter (as shown in FIG. 1).

Figure 4:
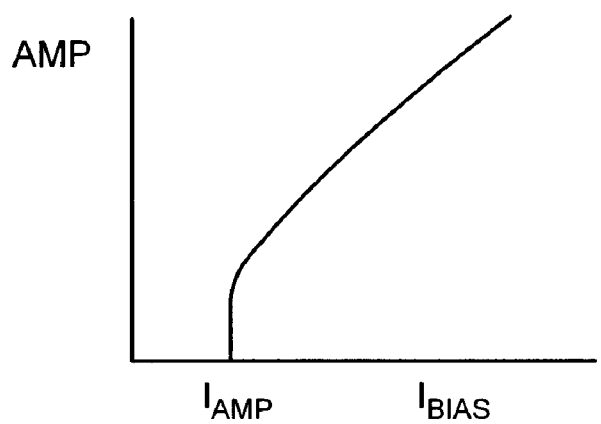
FIG. 4 is a graph of amplitude versus bias current across the transistor of FIG. 2, showing non-linearities beyond a critical current value.

Although a Pierce arrangement having a single transistor enjoys a lessened non-linear effect on the oscillation frequency, non-linearity nonetheless remains on the output amplitude as a function of the $I_{BIAS}$ current, as shown in FIG. 4 when referencing FIG. 2. For example, FIG. 4 illustrates how the oscillation amplitude will sharply rise when the bias current exceeds $I_{AMP}$. Beyond that amplitude, the non-linearity of the gate voltage versus the drain current for transistor 26 (FIG. 2) begins to have an effect. For example, FIG. 4 shows that the amplitude of the oscillation can be increased only at the price of increased biasing current. Thus, to mitigate the need for rather large biasing current values, the biasing current must be regulated at or near $I_{AMP}$. Current consumption and unwanted harmonics in the amplifier output are minimized by providing the smallest bias current that allows the amplifier to compensate losses in the resonator at the desired oscillation amplitude.

Figure 5:
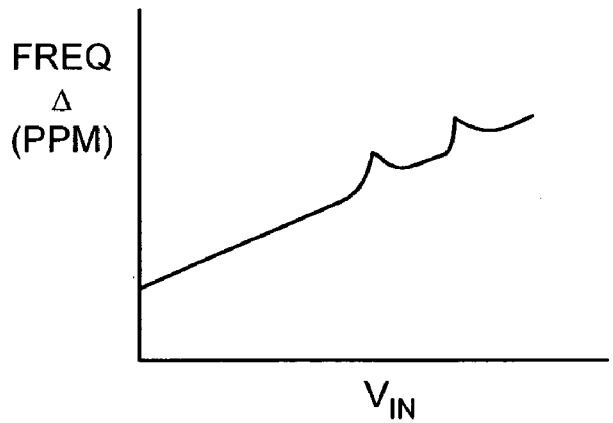
FIG. 5 is a graph of frequency fluctuations at different input voltages, showing unwanted harmonics from the crystal induced upon the amplifier when the amplifier produces non-linear outputs.

If the biasing current is allowed to increase so that transistor 26 (FIG. 2) is placed in saturation region, then harmonics can occur in the crystal. Thus, as shown in FIG. 5, as the input voltage $V_{IN}$ increases, frequency fluctuations can occur at certain harmonic modes of oscillation. As will be recognized in all piezoelectric crystals, there are several low-impedance harmonic modes of oscillation. While one mode might be at the resonant frequency, there are still nonetheless other harmonic modes at which the crystal can resonate, albeit possibly at a higher impedance than the first harmonic mode. FIG. 5 illustrates at least two other harmonic modes which can be established by the considerable biasing values placed onto the crystal whenever the Pierce-arranged transistor 26 is driven hard to its saturation region.

The CMOS inverter, Pierce-arranged transistor, and the effects thereof shown in FIGS. 1–5 are sometimes less than optimal since the amplitude of voltage values across the crystal do not include any form of regulation that would minimize the harmonic modes of oscillation. For example, FIG. 1 illustrates a form of regulation made purely by the non-linearity of the CMOS inverter. When the oscillation becomes rather large in amplitude, the amplifier will have a marginal decrease in gain at the peaks or rails of the CMOS output/input. The change in gain over the CMOS inverter input/output causes amplifier non-linearity and induces harmonics into the crystal.

A Pierce configuration, while implemented using a minimum component count, oftentimes relies upon individual device characteristics to set the regulation level. Alternatively, rather sophisticated and complex rectification, filtering, and error amplification can be used to regulate the crystal. Other arrangements rely on external components to set the amplitude regulation bandwidth. Clearly, another alternative embodiment is needed to regulate the gain and the amplitude of the amplifier (as seen by the crystal), which does not rely on costly additional components, and external rectification, filtering, and error amplification, yet also does not rely simply on the individual device characteristics within the amplifier itself.

Figure 6:
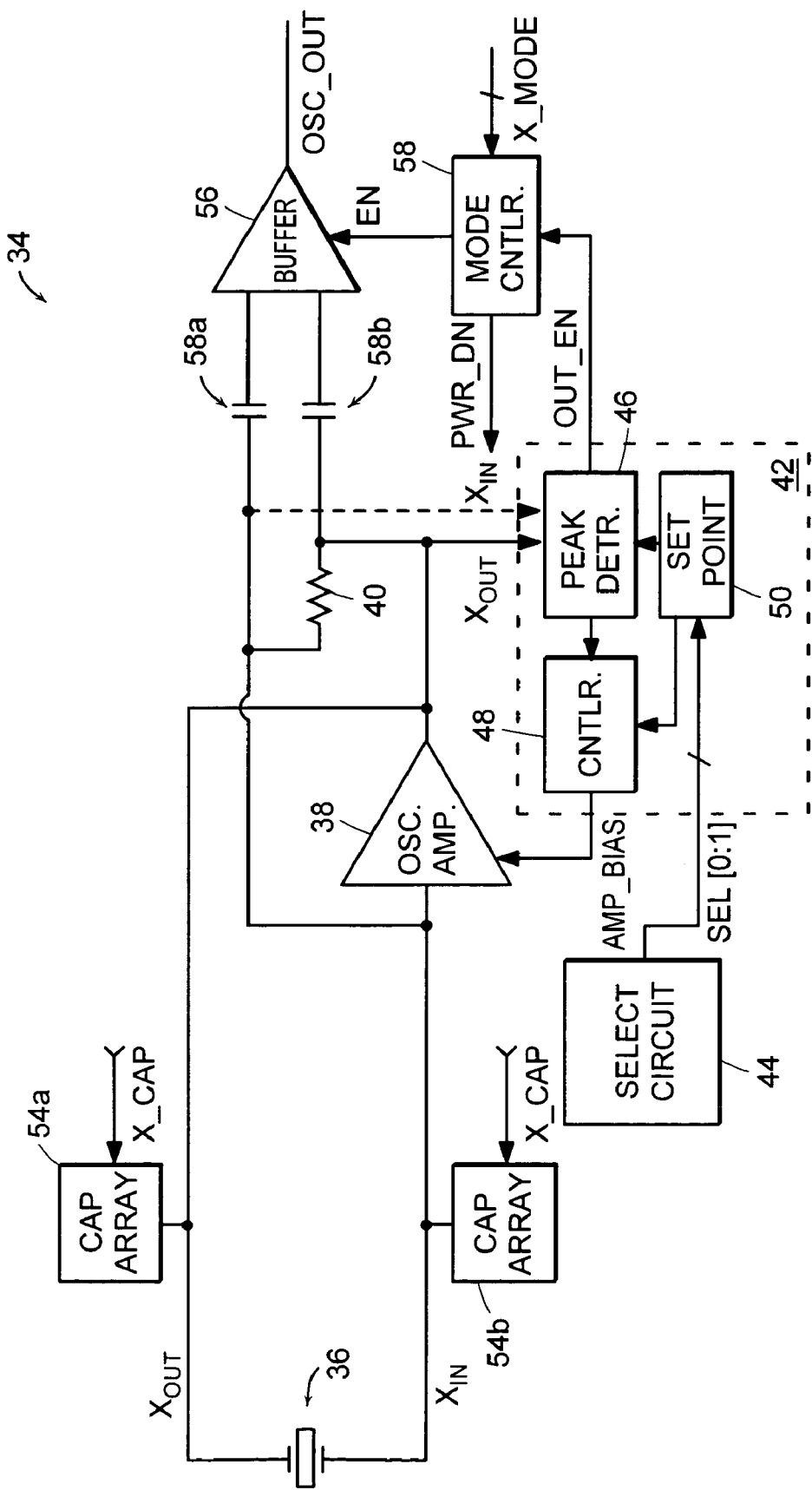
FIG. 6 is a block diagram of a crystal oscillator circuit and system having a setpoint circuit, a peak detector, a controller, and an oscillator amplifier for measuring amplitude across the crystal resonator, comparing the measured amplitude with an amplitude setpoint to adjust a bias current, and adjusting the gain of the amplifier within a more linear range using the bias current to minimize unwanted harmonics from the crystal resonator.

FIG. 6 illustrates an alternative embodiment in which the amplitude is detected and regulated using a peak detector, setpoint circuit, and controller which regulate a symmetrical Pierce arrangement of an oscillator amplifier. FIG. 6 shows an oscillator circuit and system 34. Oscillator 34 can be made of any resonant circuit and, in the example shown, illustrates a crystal resonator 36. Crystal 36 can be maintained off the chip or on the integrated circuit, which contains all of the other components shown. Crystal 36 may include any piezoelectric material than transforms mechanical vibrations into electrical impulses or vice-versa. Wire leads can be connected to the faces of the crystal, and a popular material used for the crystal includes quartz. The frequency at which the quartz crystal vibrates depends on the method for cutting the crystal, and also on the crystal thickness. The wires leading from crystal 36 are connected to a pair of nodes, labeled $X_{OUT}$ and $X_{IN}$.

An oscillator amplifier 38 is used to impart vibrations into crystal 36. Vibrations can be induced from a voltage differential placed across the pair of nodes in the form of an amplitude. Amplifier 38 is shown in more detail in FIG. 8, and provides gain at the resonant frequency to allow sustained oscillations to occur. A feedback resistor 40 is also coupled across amplifier 38 and the nodes of crystal 36. A preferred feature of amplifier 38 is that it can be regulated so that its gain and resulting amplitude are controlled. An amplitude detector and regulator circuit 42 is shown coupled between at least one node of the crystal and the amplifier 38 to detect a peak voltage within the node, and bias the amplifier according to that peak voltage. The amount of biasing is determined from comparing the peak voltage in the $X_{OUT}$, $X_{IN}$, or both with a setpoint maintained within a select circuit 44.

If the peak voltage value read on $X_{OUT}$, $X_{IN}$, or both is greater in absolute magnitude than an amplitude setpoint value from select circuit 44, then the AMP_BIAS current value will be decreased. Prior to that time, however, the bias current (AMP_BIAS) is allowed to extend upward in value in order to impart significant gain upon amplifier 38. However, once the resulting amplitude exceeds the peak value stored as a setpoint, then the gain of amplifier 38 is reduced. This action provides maximum amplifier gain when it is needed to insure that the oscillations will start reliably, and in the least amount of time required. The goal of regulation circuit 42 is to regulate amplifier 38 so that the amplifier will compensate for any losses within crystal 36. However, regulation circuit 42 does not overdrive amplifier 38 when substantial gain is not needed, nor does regulation circuit 42 rely primarily on amplifier non-linearities to cause the amplifier to lose gain as the amplitude gets larger and larger.

Peak detector 46 within regulation circuit 42 thereby looks at the oscillation amplitude and tracks the envelope of the oscillation amplitude. For example, peak detector 46 might track the lowest peak voltage value of the sinusoidal signals across the crystal nodes, and produces an output that is sent to controller 48. Controller 48 can then compare the setpoint chosen from a setpoint circuit 50 with the peak voltage value from peak detector 46. Depending on where the peak voltage value exists (i.e., the amplitude) relative to the setpoint, the biasing current will be adjusted to control the gain of amplifier 38. When oscillator 34 encounters a start-up mode, amplifier 38 will be placed into a high gain region and the biasing will be rather large. As the amplitude of the oscillating signal begins to increase, it will eventually increase beyond the amplitude setpoint, causing controller 48 to decrease the biasing current until, eventually, the amplitude peak value will match the setpoint.

As shown in FIG. 6, select circuit 44 can output two select signals. The first select signal is used as the amplitude setpoint, and is a predefined value of current somewhat less than the maximum gain of amplifier 38. The output will be disabled until the amplitude is greater than a second setpoint (i.e., a second select signal), which is less in absolute magnitude than the first setpoint (amplitude setpoint). However, once the amplitude exceeds the second setpoint, the output will be enabled and no restrictions will be placed on the biasing current within the oscillator amplifier 38. This allows the amplifier to achieve maximum gain until the amplitude reaches the first setpoint (amplitude setpoint). Once the amplitude achieves the first setpoint, then the biasing current is restricted by virtue of a regulated current from controller 48 placed into the biasing node. Details of regulation circuit 42 are better illustrated in FIG. 7 (described below). It should be noted, however, that FIG. 7 illustrates only one example by which the various components 46, 48, and 50 are formed.

FIG. 6 illustrates other features of oscillator 34 including varactors 54a and 54b placed on the input and output nodes of oscillator 34. Varactors 54 can have adjustable capacitance values by enabling certain capacitors coupled in parallel with one another via an enabling word (X_CAP). The enabling word will select one or more capacitors coupled in parallel to form a capacitance value and, thus, the digital word will correspond to a capacitance value. Alternatively, analog varactors can be used, wherein the varactor capacitance is controlled by a continuously variable voltage. A single control voltage can be distributed to all capacitors for controlling the oscillation frequency. FIG. 6 also illustrates a buffer 56 coupled to receive the oscillation signal across amplifier 38 and crystal 36. According to one example, buffer 56 can be a differential amplifier with decoupling capacitors 58a and 58b configured as high-pass filter elements to the input of buffer 56. Buffer 56 can function as a differential amplifier to form a single-ended output (OSC_OUT). The single-ended output can be used as a clocking signal to an electronic subsystem, for example. The output from buffer 56 can be selectively enabled or disabled depending on the amplitude reached by amplifier 38. For example, if the amplitude is less than the second setpoint sent to setpoint circuit 50, then the output enable signal (OUT_EN) will signify to mode controller 58 that the output from buffer 56 should be disabled.

In addition to disabling the oscillator output, mode controller circuit 58 can also have various power saving features controlled by an externally-sent word (X_MODE). Mode controller 58 can respond to the external word by powering down certain component elements of oscillator 34 when not in use via power-down signal (PWR_DN). Mode controller 58 can also be used for other functions, enhancements, or features to selectively control inputs, outputs, and individual functionality of components within oscillator 34, all as would be appreciated to those skilled in the art having the benefit of this disclosure.

Figure 7:
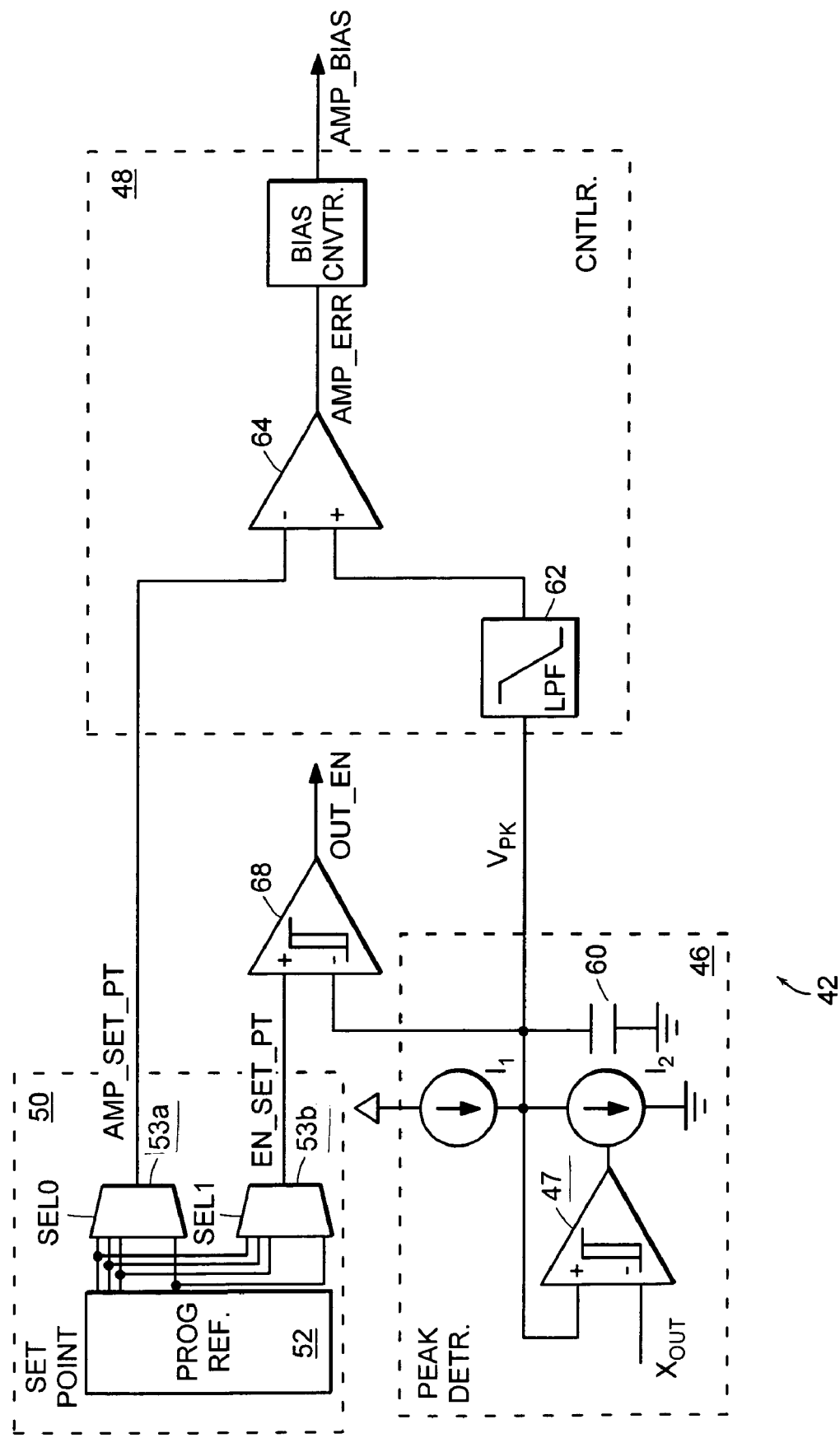
FIG. 7 is a detailed circuit schematic of the setpoint circuit, the peak detector and the controller of FIG. 6.

Turning now to FIG. 7, details of peak detector component 46, controller 48, and setpoint circuitry 50 are shown. Beginning with setpoint circuitry 50, first and second selection signals form specified, predetermined voltage values by selecting one of a plurality of voltages from a programmable reference voltage source 52 via multiplexers 53a and 53b. The programmable voltage reference circuit 52 can be realized using a band-gap reference circuit that is integrated along with the overall circuitry of the oscillator. Band-gap reference circuitry is generally well known in the art, and designs can be obtained from numerous manufacturers for use in producing reference voltages from possibly a single reference voltage or multiple reference voltages. The reference voltages produced from circuit 52 can be offset from each other by a fixed amount if desired, and the selection signals (SEL0 and SEL1) are used to select a particular setpoint. The first setpoint is shown as the amplitude setpoint (AMP_SET_PT), while the second setpoint is the output enable setpoint (EN_SET_PT).

Peak detector circuit 46 generally includes a comparator 47 that compares the voltage on one of the nodes (i.e., $X_{OUT}$) with a stored peak voltage value. A hold capacitor 60 is used to store the peak voltage value. Depending on the comparison of the stored peak voltage value with $X_{OUT}$, comparator 47 controls a current source $I_2$. Current source $I_1$ supplies a smaller current than $I_2$ and is always on. If $I_2$ does not turn on, the hold capacitor 60 will increase to the positive supply rail. If the instantaneous voltage at $X_{OUT}$ is below the hold capacitor voltage, comparator 47 will turn on current source $I_2$. Since $I_2$ can sink more current than $I_1$ can source when $I_2$ is turned on, the voltage on the hold capacitor 60 will decrease. Once the voltage on the hold capacitor matches the voltage at $X_{OUT}$, the comparator 47 will turn off the current source $I_2$.

Current source $I_2$ is large enough to allow the current to track the valleys or negative peaks of $X_{OUT}$ waveform. Once the floor of $X_{OUT}$ waveform is reached, circuit 46 will hold the detected peak with a slight increase toward the positive supply voltage, due to current source $I_1$ adding charge. If the current sources $I_1$ and $I_2$ are sized appropriately for the hold capacitor 60 and frequency of operation, the voltage across the hold capacitor 60 is the detected peak of the $X_{OUT}$ waveform. Thus, the voltage on the hold capacitor 60 can be used to measure the amplitude of $X_{OUT}$. Another comparator input connected to $X_{IN}$ can be added to measure the maximum amplitude of either $X_{IN}$ or $X_{OUT}$ (peak value will be the largest amplitude).

Once the amplitude is known, it is passed through a low-pass filter 62 and subtracted from the desired amplitude setpoint that is selected from multiplexer 53a. The programmable reference circuit 52 is illustrated as a band-gap reference or simply a resistor string with multiple taps. The desired amplitude setpoint is subtracted from the amplitude detected by the peak detector via comparator 64 to form an amplitude error (AMP_ERR) at the output of comparator 64. This amplitude error is mapped to an amplifier gain current by a bias converter or mapping circuit 66. If the amplitude error is positive (i.e., the detected amplitude is less than the desired amplitude), then controller circuit 48 will increase the amplifier bias current and will cause the oscillation amplitude to increase.

The output enable circuit includes an enable setpoint output (EN_SET_PT) from multiplexer 53b. The enable circuit is used to detect an amplitude of oscillation that is smaller than any of the desired selectable amplitude setpoints, as measured in absolute values. This enable setpoint, being smaller than the amplitude setpoint, is compared to the detected amplitude on the hold capacitor 60 using a comparator 68 with hysteresis. Once the detected amplitude exceeds in absolute magnitude the selected enable setpoint, the output enable signal (OUT_EN) is asserted. The output enable signal is not asserted until the detected amplitude is larger than the amplitude set by the minimum amplitude trip point.

Figure 8:
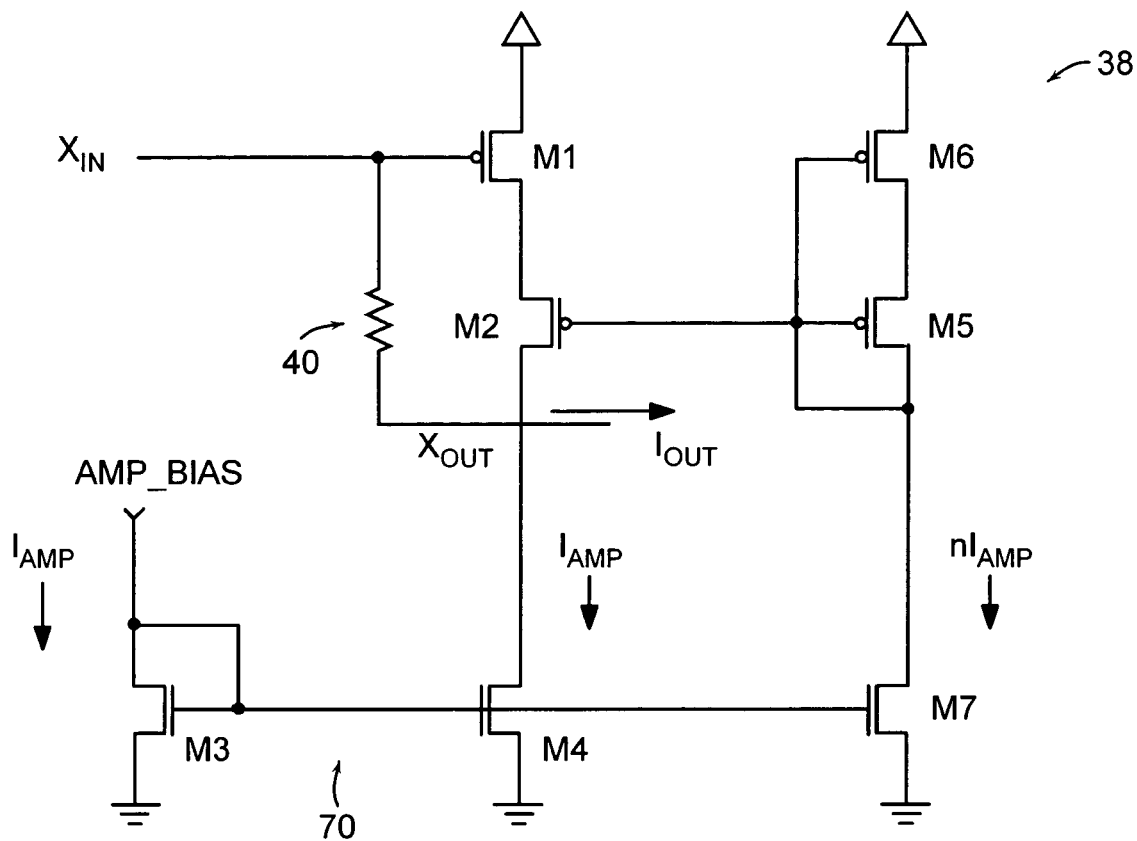
FIG. 8 is a circuit schematic of the oscillator amplifier of FIG. 6.

Details of oscillator amplifier 38 are shown in FIG. 8, according to one embodiment of the invention. As shown in FIG. 8, transistors M3, M4, and M7 are coupled to form a current mirror. The external control loop 70 applies the control current $I_{AMP}$ to transistor M3. Transistors M4 and M7 are sized so that $I_{AMP}$ will flow through M4 and n*$I_{AMP}$ will flow through transistor M7. Since transistor M4 is attached to the amplifier output node $X_{OUT}$, the maximum amount of current the amplifier can sink is $I_{AMP}$.

The maximum current that transistor M1 can source to the output node ($X_{OUT}$) is determined by the voltage at the amplifier input node ($X_{IN}$). If the voltage at $X_{IN}$ is close enough to the positive supply voltage, transistor M1 will only supply a very small leakage current to $X_{OUT}$, and the amplifier will sink a current of $I_{AMP}$ from $X_{OUT}$ to ground through transistor M4. On the other hand, if $X_{IN}$ is close to the negative supply voltage, transistor M1 will be able to supply currents much larger than the bias current $I_{AMP}$ to $X_{OUT}$. Under this condition, the current that can be sourced through transistors M1 and M2 will be determined by the gate voltage on transistor M2. Thus, at oscillation amplitude peaks, the current the amplifier will sink is the current through transistor M4 since the current through transistors M1 and M2 is orders of magnitude smaller. At oscillation amplitude valleys, the current the amplifier will source is the current through transistor M2 minus the current through transistor M4.

FIG. 8 illustrates a preferred circuitry for oscillator amplifier 38. An external amplitude control loop 70 is used to adjust the current flowing into transistor M2 and, thus, control the transconductance of transistor M2 which is also controlled by a diode-connected transistor control loop consisting of transistor M5, in conjunction with transistors M6 and M7. The biasing current (AMP_BIAS) from control circuit 42 (FIG. 6) thereby controls the bias current $I_{AMP}$ through transistor M4. The amount of current sourced from the $X_{OUT}$ node will preferably be substantially equal to the amount of current sunk into that node, thereby ensuring amplifier 38 is symmetrical. If current sourced from the oscillator node does not equal the current sunk into the oscillator node, then the oscillator can enter non-linear operation ranges and variations in gain, depending on changes in the amplitude between the input and output nodes of the oscillator. Preferably, at steady state, amplifier 38 must sink as much current as it sources. This ensures that transistors M1 and M2 will be on just long enough to balance the current that flows into and out of the oscillator nodes. Thus, when the voltage $X_{IN}$ is at its maximum value, transistor M1 will be off which means the $I_{AMP}$ will flow through transistor M4. When the voltage $X_{IN}$ is at its minimum value, n*$I_{AMP}$ will flow through both transistors M1 and M2, and $I_{AMP}$ will flow through transistor M4. If transistor M4 was off, n*$I_{AMP}$ would be available at $X_{OUT}$. However, transistor M4 is on, so only (n−1)*$I_{AMP}$ is available at the output when the voltage $X_{IN}$ is at its minimum value. Thus, transistor M4 is always on and always has a current $I_{AMP}$ flowing through it.

FIG. 8 illustrates a composite common source/common gate amplifier configuration made up of transistors M1 and M2. The bias at the gate of transistor M2 controls the amount of current that can flow between the source and drain of transistor M2. Transistor M2 thereby acts as a current limit device, where the maximum current is controlled by the bias network consisting, essentially, of transistors M7, M5, and M6. If the current flowing through transistor M5 limits the current through transistor M2 to an integer n multiplied by the bias current $I_{AMP}$, the maximum current the amplifier 38 can source will be the current through both M1 and M2 minus the current through M4. Where n=2, the current sourced will thereby equal the current sunk.

The current limit device and the diode-coupled transistor configuration of transistor M5 can be sized along with transistors M6 and M7 to force the required amount of symmetry between the positive and negative half cycles of the output, so that the integer value n=2. The sizes of transistors M5, M6, and M7, of course, are proportional to the sizes of transistors M1, M2, and M4. Likewise, since transistors M3 and M4 are connected in a mirrored arrangement, the sizes of those transistors are preferably equal. It is recognized that the transistors M1–M7 of FIG. 8 are shown as FETs. However, it is equally recognized that the transistors can be bipolar transistors if bipolar technology is used instead of MOS FETs.

Figure 9:
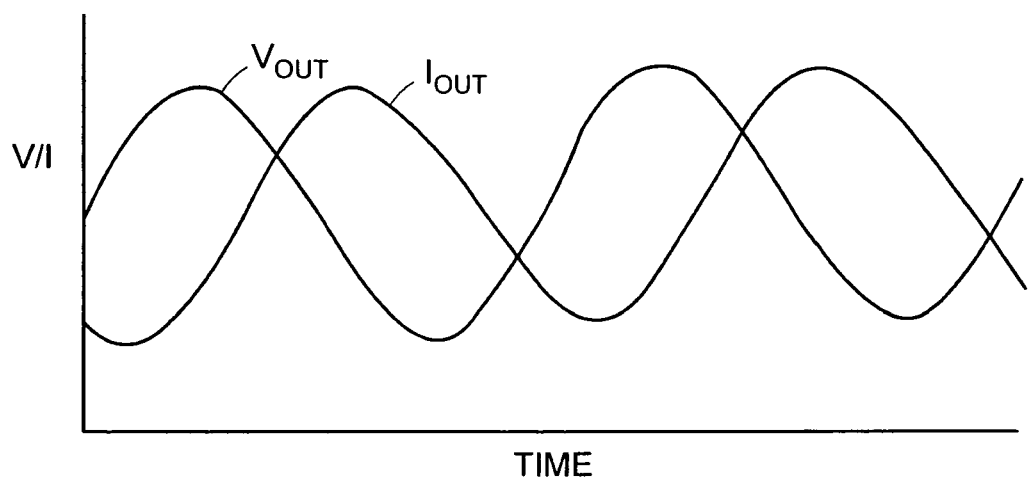
FIG. 9 is a timing diagram of voltage across the $X_{IN}$ and $X_{OUT}$ nodes of the crystal resonator and current sourced by, and sunk to, the $X_{OUT}$ node of the crystal resonator, showing a symmetric oscillator amplifier output.

The current limit transistor M2 and the bias network of transistors M5–M7 are sized with an appropriate width and length ratio to force the required amount of symmetry between the positive and negative half cycles of the output, as shown in FIG. 9. The output current $I_{OUT}$ is shown having a rounded negative half cycle, without any substantial current peaks during that half cycle as in conventional designs. The output current is preferably symmetric about 0 amps. The output voltage is symmetric about the average value of the oscillation output, which is determined by the value of $I_{AMP}$ through the amplifier. Since the output voltage and current are sinusoidal, output harmonics are minimized.

Figure 10:
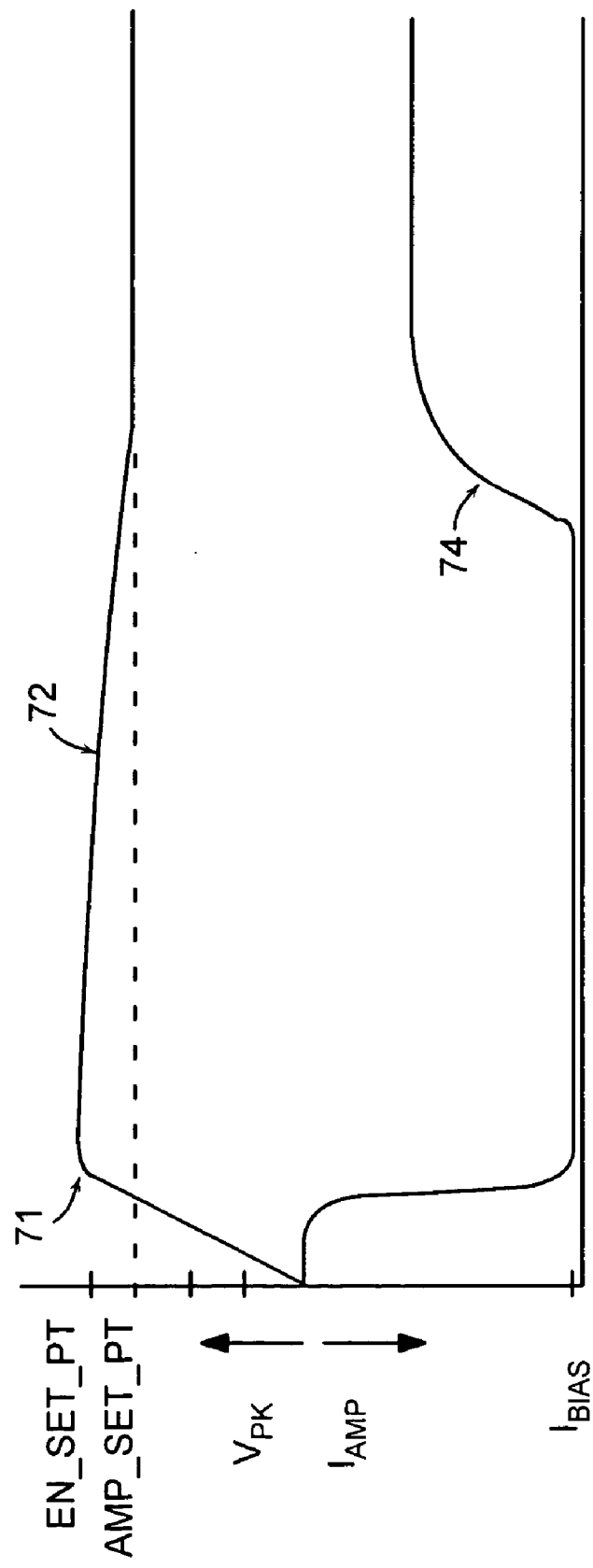
FIG. 10 is a extended timing diagram of amplitude across the $X_{IN}$ and $X_{OUT}$ nodes, as well as the bias current within the amplifier of the crystal oscillator.

While FIG. 9 illustrates the symmetrical operation of amplifier 38, FIG. 10 illustrates the timed activation of the regulation circuit 42, and its application to the amplifier 38 shown in FIG. 6. More specifically, FIG. 10 illustrates a timing diagram of current and voltage. The current is shown increasing along the arrow marked $I_{AMP}$. The voltage at node $V_{PK}$ from FIG. 7 is shown increasing along the arrow marked $V_{PK}$. When power is initially applied to the circuit, the voltage on capacitor 60 is zero. As a result, the voltage $V_{PK}$ is zero at time zero. This is translated by the controller 48 as a maximum amplitude, so that a minimum bias current ($I_{AMP}$) is applied to the oscillator amplifier. Under this condition, the amplifier does not have enough gain to initiate oscillations. Current source $I_1$ supplies a small flow of current to the capacitor 60 causing the value of $V_{PK}$ to increase. This condition continues until $V_{PK}$ is equal to the DC voltage at $X_{IN}$ and/or $X_{OUT}$ which is labeled 71. This is translated by the controller 48 as a minimum amplitude, so that a maximum bias current $I_{AMP}$ is applied to the oscillator amplifier. Now the amplifier has enough gain to initiate oscillations.

As the oscillations grow, comparator 47 and current source $I_2$ act to track the valley of the oscillation as previously described so that $V_{PK}$ will be approximately equal to the minimum voltage at Xin and/or Xout. The amplitude will increase along path 72 until the detected amplitude $V_{PK}$ is equal to the desired amplitude determined by voltage AMP_SET_PT. As $V_{PK}$ approches AMP_SET_PT, $I_{AMP}$ decreases along path 74 until $I_{AMP}$ is the minimum value needed to sustain oscillation at the desired amplitude AMP_SET_PT.

If desired, a second amplitude set point, EN_SET_PT can be detected by comparator 68 (FIG. 7) to enable the oscillator output once the detected oscillation amplitude is large enough for $V_{PK}$ to drop below EN_SET_PT. Comparator 68 (FIG. 7) controls the OUT_EN voltage, which signals mode controller 58 (FIG. 6) to disable or enable output buffer 56 (FIG. 6). If $V_{PK}$ is greater than EN_SET_PT, output buffer 56 is disabled. If $V_{PK}$ is less than EN_SET_PT, output buffer 56 is enabled.

Numerous variations and modifications will become apparent to those skilled in the art, once the above disclosure is fully appreciated. It is intended that the following claims are to be interpreted to embrace all such variations and modifications. In addition, the foregoing description is illustrative of only exemplary embodiments. For example, a capacitor array can be used by the present oscillator to convert it into a frequency pulling oscillator for use with voltage-controlled crystal oscillator applications, and those which use, for example, varactors. Electrostatic protection devices can also be coupled to each of the input nodes, and the selection circuit can be any form of voltage supply, such as a band-gap circuit or a reference resistor string, possibly using a voltage divider resistive network. The peak detector can measure either the input node peak, the output node peak, or both the input and output node peaks. Regardless of which peak is being detected, the holding capacitor will track and hold the peak value. The maximum or minimum peaks, or both, could be detected. If, for example, the input node is being measured, the other node can be connected to a supply voltage to disable it. The mode controller circuit enables and disables the output buffer that is designed to create a differential signal 180° phase offset, and converts a differential signal into a single-ended output for use as a clock signal, for example.

The various circuit features set forth in the present disclosure are not to be interpreted as reflecting all possible features of the claimed invention. The specification and drawings are, therefore, to be regarded in an illustrative rather than a restrictive sense.

What is claimed is:

1. An oscillator, comprising:
    a peak detector coupled to determine a peak voltage value;
    a controller coupled to the peak detector for comparing the peak voltage value against a predetermined voltage value and to decrease a bias current if the peak voltage value is greater in absolute magnitude than the predetermined voltage value;
    an oscillator amplifier having a bias node through which the bias current is forwarded to regulate gain of the amplifier;
    a pair of nodes to which a crystal resonator is coupled;
    a pair of transistors coupled in series, with one of the pair of transistors coupled to the input node and the other of the pair of transistors coupled to the output node; and
    a current mirror having the bias current forwarded through a third transistor that is current mirrored to a fourth transistor coupled in series with the pair of transistors.

2. The oscillator as recited in claim 1, wherein the peak detector comprises:
    a holding capacitor coupled to store the peak voltage value;
    a comparator adapted to compare the stored peak voltage value against a sinusoidal signal; and
    a current source coupled to and controlled by an output of the comparator for discharging the holding capacitor if the sinusoidal signal exceeds in amplitude the stored peak voltage value.

3. The oscillator as recited in claim 2, wherein the controller comprises:
    a low pass filter coupled to filter the stored peak voltage value; and
    a differential amplifier adapted to amplify a difference between the filtered, stored peak voltage value and the predetermined voltage value.

4. The oscillator as recited in claim 1, wherein one of said pair of nodes is the bias node or, alternatively, output node, and the other of said pair of nodes is an input node.

5. The oscillator as recited in claim 4, wherein the oscillator amplifier comprises:
   a first transistor having a first gate terminal, a first source terminal and a first drain terminal, wherein the first gate terminal is coupled to the input node; and
   a second transistor having a second gate terminal, second source terminal and second drain terminal, wherein second source terminal is coupled to the first drain terminal, and wherein the second drain terminal is coupled to the output node.

6. The oscillator as recited in claim 5, wherein the oscillator amplifier comprises:
   a third transistor having a third gate terminal, a third source terminal and a third drain terminal, wherein the third drain terminal is coupled to receive the bias current; and
   a fourth transistor having a fourth gate terminal, a fourth source terminal and a fourth drain terminal, wherein the fourth gate terminal is coupled to the third gate terminal, and wherein the fourth drain terminal is coupled to the second drain terminal.

7. The oscillator as recited in claim 1, further comprising:
   a second predetermined voltage value of less absolute magnitude than the predetermined voltage value; and
   an output enable comparator coupled to compare the peak voltage value against the second predetermined voltage value and to enable output from the crystal oscillator only if the peak voltage value exceeds the second predetermined voltage value.

8. The oscillator as recited in claim 1, further comprising a buffer coupled to amplify differences in voltages between the output node and an input node of the crystal oscillator.

9. A crystal oscillator, comprising:
   a pair of nodes;
   a crystal coupled between the pair of nodes;
   an oscillator amplifier coupled between the pair of nodes for producing a sinusoidal signal upon the pair of nodes;
   a peak detector coupled to at least one node of the pair of nodes for determining a peak voltage value of the sinusoidal signal and for regulating the amplitude of the sinusoidal signal depending on an amount by which the peak voltage value exceeds a predetermined voltage value;
   a first transistor having a first gate or base terminal, a first source or emitter terminal, and a first drain or collector terminal;
   a second transistor having a second gate or base terminal, a second source or emitter terminal, and a second drain or collector terminal, wherein the first gate or base terminal is coupled to one of the pair of nodes and the second drain or collector terminal is coupled to the other one of the pair of nodes;
   a diode-coupled fifth transistor having a gate or base terminal, a source or emitter terminal, and a drain or collector terminal; and
   wherein the gate or base terminal of the fifth transistor is coupled to the second gate or base terminal;
   a third transistor having a third gate or base terminal, a third source or emitter terminal and a third drain or collector terminal, wherein the third drain or collector terminal is coupled to receive a bias current whose magnitude is proportional to the amount by which the peak voltage value exceeds a predetermined voltage value;
   a fourth transistor having a fourth gate or base terminal, a fourth source or emitter terminal and a fourth drain or collector terminal, wherein the fourth gate or base terminal is coupled to the third gate or base terminal, and wherein the fourth drain or collector terminal is coupled to the second drain or collector terminal;
   wherein the fourth drain or collector terminal receives the same current magnitude as the bias current; and
   wherein the drain or collector terminal of the fifth transistor receives twice the current magnitude as the bias current.

10. The crystal oscillator as recited in claim 9, further comprising:
    a second predetermined voltage value of less absolute magnitude than the predetermined voltage value;
    an output enable comparator coupled to compare the peak voltage value against the second predetermined voltage value and to enable output from the crystal oscillator only if the peak voltage value exceeds the second predetermined voltage value.

11. A method for regulating an output from an oscillator, comprising:
    producing a sinusoidal signal between a pair of nodes;
    determining if a peak amplitude of the sinusoidal signal exceeds or is less than a predetermined voltage value, as measured on the pair of nodes that are not connected to ground or a power supply;
    changing a bias current supplied to an amplifier coupled between the pair of nodes depending on the amount by which the peak amplitude exceeds or is less than the predetermined voltage value to adjust gain within the amplifier; and
    disabling output from the oscillator if the amplitude of the sinusoidal signal has not reached a second predetermined voltage value less than the predetermined voltage value.

12. The method as recited in claim 11, further comprising equalizing an amount of current sourced from the pair of nodes with current sunk into the pair of nodes to produce a symmetrical sinusoidal signal between the pair of nodes.

13. The method as recited in claim 11, further comprising adjusting gain within the amplifier to a linear operating region of the amplifier.

14. The method as recited in claim 11, further comprising coupling a crystal between the pair of nodes that vibrates at a resonate frequency, and pulling a frequency of the sinusoidal signal to a higher or lower frequency proportional to varying capacitive values on at least one of the pair of nodes.

* * * * *